(12) United States Patent  
Parulkar

(10) Patent No.: US 7,783,946 B2
(45) Date of Patent: Aug. 24, 2010

(54) SCAN BASED COMPUTATION OF A SIGNATURE CONCURRENTLY WITH FUNCTIONAL OPERATION

(75) Inventor: Ishwardutt Parulkar, San Francisco, CA (US)

(73) Assignee: Oracle America, Inc., Redwood City, CA (US)

( * ) Notice: Subject to any disclaimer, the term of this patent is extended or adjusted under 35 U.S.C. 154(b) by 192 days.

(21) Appl. No.: 11/940,043

(22) Filed: Nov. 14, 2007

(65) Prior Publication Data

US 2009/0125770 A1    May 14, 2009

(51) Int. Cl.
*G01R 31/28* (2006.01)
(52) U.S. Cl. .................. 714/726; 714/731; 714/732
(58) Field of Classification Search .......... None
See application file for complete search history.

(56) References Cited

U.S. PATENT DOCUMENTS

| | | | |
|---|---|---|---|
| 7,055,077 B2 * | 5/2006 | Kiryu et al. | 714/726 |
| 7,188,284 B2 * | 3/2007 | Mitra et al. | 714/726 |
| 7,272,761 B2 * | 9/2007 | Rich et al. | 714/726 |
| 7,278,076 B2 * | 10/2007 | Zhang et al. | 714/726 |

OTHER PUBLICATIONS

Author Unknown, "Automatic test pattern generation", Wikipedia, http://en.wikipedia.org/wiki/Automatic_test_pattern_generation, 4 pages, at least as early as Jun. 28, 2007.
Author Unknown, "Built-in self-test", Wikipedia, http://en.wikipedia.org/wiki/BIST, 2 pages, at least as early as Jun. 28, 2007.
Author Unknown, "Design for Test", Wikipedia, http://en.wikipedia.org/wiki/Design_For_Test, 4 pages, at least as early as Jun. 28, 2007.
Author Unknown, "Observability", Wikipedia, http://en.wikipedia.org/wiki/Observability, 1 page, at least as early as Jun. 28, 2007.
Author Unknown, "Scan chain", Wikipedia, http://en.wikipedia.org/wiki/Partial_scan, 1 page, at least as early as Jun. 28, 2007.
Brisacher et al., "The history and future of scan design", EE Times: Design News, http://www.eetimes.com/showArticle.jhtml?articleID=170701653, 8 pages, Sep. 19, 2005.

(Continued)

*Primary Examiner*—Christine T Tu
(74) *Attorney, Agent, or Firm*—Gregory P. Durbin; Polsinelli Shughart PC

(57) ABSTRACT

A method and circuit for capturing and observing the internal state of an integrated circuit that utilizes a scan chain capable of capturing the functional state of an integrated circuit during functional testing without interrupting the functional testing. The functional state may be captured by and shifted out of the scan chain concurrently with functional testing. The scan chain includes sequential elements, each having a functional state and a scan state that operate in parallel. The method and circuit may further include a signature analyzer for compressing the contents of the scan chain into a signature. The method and circuit may capture and compress multiple functional states into a combined signature.

8 Claims, 7 Drawing Sheets

OTHER PUBLICATIONS

Ferreira, J. M. Martins, "Scan design techniques", FEUP/DEEC, www.fe.up.pt/~jmf, 7 pages, at least as early as Nov. 13, 2007.

Jaramillo et al., "10 tips for successful scan design: part one", EDN, ednmag.com, pp. 67-75, Feb. 17, 2000.

Jaramillo et al., "10 tips for successful scan design: part one", EDN, ednmag.com, pp. 77-90, Feb. 17, 2000.

Min et al., "Analysis of Detection Capability of Parallel Signature Analyzers", IEEE Transactions on Computers, vol. 40, No. 9, pp. 1075-1081, Sep. 1991.

* cited by examiner

SCAN BASED COMPUTATION OF A SIGNATURE CONCURRENTLY WITH FUNCTIONAL OPERATION

FIELD OF THE INVENTION

The present invention relates to testing of integrated circuits. In particular, the present invention relates to scan based computation of a signature concurrently with functional testing of the integrated circuit.

BACKGROUND

During manufacturing test, debug and diagnosis of an integrated circuit, visibility into the internal state of the integrated circuit is often needed. Defects in the fabricated circuit may manifest themselves as erroneous states in flip-flops which may or may not be propagated to the integrated circuit pins or pads during testing.

Two general categories of testing may be employed to test the integrated circuit. The first category of testing may be referred to as functional testing. Functional testing may be utilized to verify correct circuit operation according to its functional specification. The second category of testing may be referred to as structural testing. Structural testing may use structural test patterns that may have no notion of circuit functionality (e.g., whether a floating point unit, branch prediction unit, memory interface, etc., is being tested). As such, structural testing makes no direct attempt to determine if the overall functionality of the circuit is correct. Rather, structural testing typically relies on a structural netlist to verify that the circuit has been assembled correctly from low-level building blocks.

Generally, the efficiency of test and debug is dependent on the level of observability into the internal state of the integrated circuit. Propagation of internal faults to the pins or pads of an integrated circuit may be difficult because: 1) the available automatic test equipment memory may be insufficient to hold the expected responses when stored as one bit per pin per clock cycle; 2) propagation of an internal fault to an I/O pin may become increasingly difficult as the ratio of flip flops to I/O pins increases; 3) association of an observed failure at an I/O pin with the proper internal clock cycle may become increasingly difficult as internal clock frequencies continue to increase relative to I/O clock frequencies; and/or 4) automatic test equipment may not be able to strobe output pins with plesiochronous interfaces that do not behave deterministically with respect to a reference clock.

During manufacturing test, debug and diagnosis of an integrated circuit, the integrated circuit generally undergoes testing to verify proper operation, detect failures and isolate faults. As mentioned above, two general categories of testing may be employed to test the integrated circuit, including functional testing and structural testing. Functional testing may be utilized to verify correct circuit operation according to its functional specification. Functional testing may execute functional code at speed (e.g., instruction codes for a microprocessor). Functional testing may also be used to perform speed binning, i.e., sorting a device according to operating speed range (e.g., 3 GHz, 3.5 GHz, 4 GHz, etc).

As introduced above, structural testing may use structural test patterns that may have no notion of circuit functionality (e.g., whether a floating point unit, branch prediction unit, memory interface, etc., is being tested). Structural testing typically relies on a structural netlist to verify that the circuit has been assembled correctly from low-level building blocks. For example, structural testing may be performed to verify that all specified logic gates are present, that each gate is operational, and that the gates are correctly interconnected. Structural testing is generally more efficient at targeting certain types of defects, but may not be suitable for detecting certain types of functional or at speed defects that may occur when a complex device such as a microprocessor is tested.

Structural testing generally may make use of extra circuitry added to the integrated circuit to aid testing. For example, during integrated circuit design, extra circuitry may be included on the chip to interconnect flip flops into a scan chain. Such a scan chain may be used to shift in test patterns to drive combinatorial logic. Once the pattern has been shifted in, a functional clock signal may be applied to the circuit and the results of the combinatorial logic evaluation may be captured in the scan chain flip-flops. These results may be shifted out by switching to scan mode and clocking the scan chain to serially shift out the test results.

While structural testing has become more popular due to its cost effectiveness and improved observability of faults, functional testing may still be necessary for speed binning and functional debug/diagnosis. However, as the number of logic functions included on integrated circuits continues to increase and as the internal clock rate continues to increase, functional testing becomes more difficult to perform.

During functional testing, the internal state of the chip may be inferred from knowledge of its external outputs, which is generally referred to as "observability." To be detectable, an internal fault generally has to be propagated to a point that is observable by the automatic test equipment (ATE) performing the testing, typically an output pin of the circuit. As the ratio of logic functions to number of integrated circuit pins increases, observability may become an issue because the number of defects is generally proportional to the amount of logic on the chip, while observability is generally proportional to the number of pins. Thus, holding the number of chip pins constant while increasing the amount of logic may result in decreased observability of faults (i.e., it may become more difficult to propagate a fault to an output pin).

A second issue with functional testing is that functional testing is generally performed on a cycle-by-cycle basis. A typical ATE applies test vectors to the input pins of the chip and reads results at output pins. Such an ATE generally requires a significant amount of memory, on the order of one bit per pin per test cycle. That is, the number of test vectors necessary to verify proper circuit operation is generally proportional to the amount of logic on the chip. Denser chips generally require more ATE memory to hold the additional test vectors necessary to achieve good test coverage.

A third issue with functional testing is that modern integrated circuits may employ plesiochronous input/output (I/O) pins for chip-to-chip communication. As inter-chip signaling speeds continue to increase, plesiochronous I/O pins continue to become more prevalent. Generally, in a chip-to-chip communication involving plesiochronous pins, the receiving chip has circuitry to interpret the data being received and to synchronize the data to an embedded clock by recovering the clock boundaries. Conventional ATE may not have the necessary circuitry to understand plesiochronous data.

I/O pins may generally be categorized as synchronous (data stream is synchronous with the clock pin), source synchronous (clock signal is forwarded with the data stream and used at the receiving end to synchronize the data) or plesiochronous (clock signal is embedded in the data stream). Synchronous I/O pins may operate at data rates up to 350 MHz while plesiochronous I/O pins may operate at data rates up to 10 GHz. However, conventional functional testers are generally not configured to read plesiochronous I/O pins, as discussed above. Thus, test data generally has to be applied to and be read from synchronous or source synchronous I/O pins. As a result, there may be an increasing discrepancy between the internal clock rate at which the circuit operates during at speed functional testing and the I/O clock rate at which the ATE applies test vectors and reads results. Further, the I/O data rate may be limited by the ability of on-chip drivers to drive the load on the output pin. Output pins generally drive printed circuit board traces while internal nodes are connected on the silicon substrate. Thus, internal nodes generally operate at a much higher clock rate than do I/O pins.

A fourth issue confronting functional testing is that the ATE generally reads data from I/O pins using the appropriate I/O clock to synchronize the data transfer. As a result, the observability of faults propagated to an I/O pin may occur at a much lower data bandwidth than if the faults were internally observed using the internal clock. This may present problems when trying to determine which one of the several internal clock cycles that occur during the I/O clock cycle is the one on which the fault occurred.

Scan based techniques employed during structural testing generally improve observability of faults. For example, a scan mode generally makes all flip-flops of the circuit accessible during testing and allows the flip-flops to be used as a shift register. Thus, a fault only has to be propagated to a flip-flop in the scan chain, rather than out to an I/O pin, to be detectable. FIG. 1 depicts a conventional scan chain 40 that may be used during structural testing of an integrated circuit 38. Scan chain storage elements 10, 12, 14 may be implemented using flip-flops with multiplexed inputs. Each multiplexed flip-flop 10, 12, 14 may include a two-to-one multiplexer 16, 18, 20 and a D-type flip-flop, 22, 24, 26. The multiplexers 16, 18, 20 may allow selection of either normal functional data 28 or scan input data 30. Testing is generally simplified because each multiplexed flip-flop 10, 12, 14 in the integrated circuit may be set and observed during scan mode. The flip-flops may be used to drive inputs of combinatorial logic 32, 34 and to capture outputs of the combinatorial logic 32, 34.

A scan enable signal 36, when asserted, may enable the scan mode, allowing the flip-flops in the integrated circuit 38 to be used as a serial shift register. An input pin or pad 42 may be connected to the input of the first flip-flop 10 of the scan chain 40 to allow data to be serially loaded into the scan chain 40. An output pin or pad 44 may be connected to the output of the final flip-flop 14 of the scan chain 40 to allow test results to be serially shifted out (unloaded). The chip's clock signal 46 may be used to serially load an arbitrary pattern into the scan chain of flip-flops (one bit per clock), and/or to unload the contents of the scan chain 40 (e.g., read out the state of every flip-flop). When the scan mode is selected, for example, via a scan enable pin 48, asserting the scan enable signal 36 may allow the outputs of each storage element in the scan chain 40 to become primary inputs to the combinatorial logic 32, 34, which increases controllability. The inputs of each storage element of the scan chain 40 are generally used to capture outputs of the combinatorial logic 32, 34. Observability increases because a fault only has to be propagated to an input of the scan chain 40, rather than propagated to an I/O pin. Three additional chip pins or pads are generally needed to implement scan testing: the scan input pin 42 for serial data input, the scan output pin 44 for serial data output and the scan enable pin 48 for scan mode control. The scan enable signal 36 may select between the normal functional data input 28, which comes from the combinatorial logic 32, 34, and the scan data 30, which comes from the scan input 42 or the output of the previous flip-flop.

Generally, combinatorial tests may be applied via the scan chain 40. This may be done by asserting the scan enable signal 36 to enter scan mode. Data may be serially loaded into the scan chain 40 from the scan input signal 42 to set up the desired values (e.g., the Q outputs of the flip-flops) to be applied to the inputs of the combinatorial logic 32, 34 (using one scan clock per flip-flop). Then, the scan enable signal 36 may be deactivated to select normal functional mode. The system may then apply one system clock, may apply data at the primary inputs of the chip, and may observe primary outputs of the chip. This may capture data from the combinatorial logic 32, 34 of the circuit in the flip-flops 10, 12, 14 during logic evaluation (e.g., the combinatorial logic outputs connected to the D inputs are transferred to the corresponding Q outputs of the flip-flops). That is, the results are captured and saved in the flip-flops 10, 12, 14. Finally, the scan mode may again be enabled to serially shift out the results of the test. The results may be compared to expected values to determine if the circuit passed the combinatorial test.

The scan chain 40 depicted in FIG. 1 generally uses the same clock 46 to perform scan shifting and logic evaluation. This may be undesirable when performing functional testing and using a scan chain to capture the functional state of the logic circuit. Functional testing may be interrupted (stopped) to shift out the captured state held in the scan chain. The scan chain generally has to be switched to scan mode to serially shift out the results held in the scan chain flip-flops.

What is needed is a mechanism to capture and observe the internal state of an integrated circuit concurrently with functional testing and diagnostics that does not require high-speed pins or plesiochronous pins. Further, what is needed is a way to capture and compress the internal state of the integrated circuit during testing to reduce the amount of automatic test equipment memory needed to run a functional test/diagnostic.

SUMMARY

One aspect of the present invention involves a method for capturing an internal state of an integrated circuit during a functional test. The method involves starting a functional test of the integrated circuit and preserving a first snapshot of a first functional state of the integrated circuit in a scan chain concurrently with the functional test. The method further involves reading the first snapshot.

Another aspect of the present invention involves a circuit for capturing an internal state of an integrated circuit during a functional test. The circuit includes a first plurality of storage elements configured as a scan chain having a scan output. Each storage element of the scan chain is associated with an input logic node and an output logic node. The storage elements are configured to capture a logic state of the corresponding output logic node when a capture enable signal is asserted. The storage elements are further configured to concurrently serially shift out the captured logic state when a scan clock is pulsed during the functional operation of the integrated circuit.

Yet another aspect of the present invention involves a method of generating a signature of a functional diagnostic running on an integrated circuit. The method involves executing the functional diagnostic and performing a capture operation to latch a functional state of a storage element into a scan state of the storage element. The method further involves generating a signature by shifting the scan state into a linear feedback shift register concurrently with the execution of the functional diagnostic.

DETAILED DESCRIPTION OF EMBODIMENTS OF THE INVENTION

Aspects of the present invention relate to the use of a storage element in a scan chain that has a functional mode of operation and a scan mode of operation that may operate independently of one another. The scan chain may be used to capture and shift out a functional state of an integrated circuit under test without interfering with the functional test. A signature of the contents of the scan chain storage elements may be created to reduce the time required to shift out the captured data.

Figure 1:
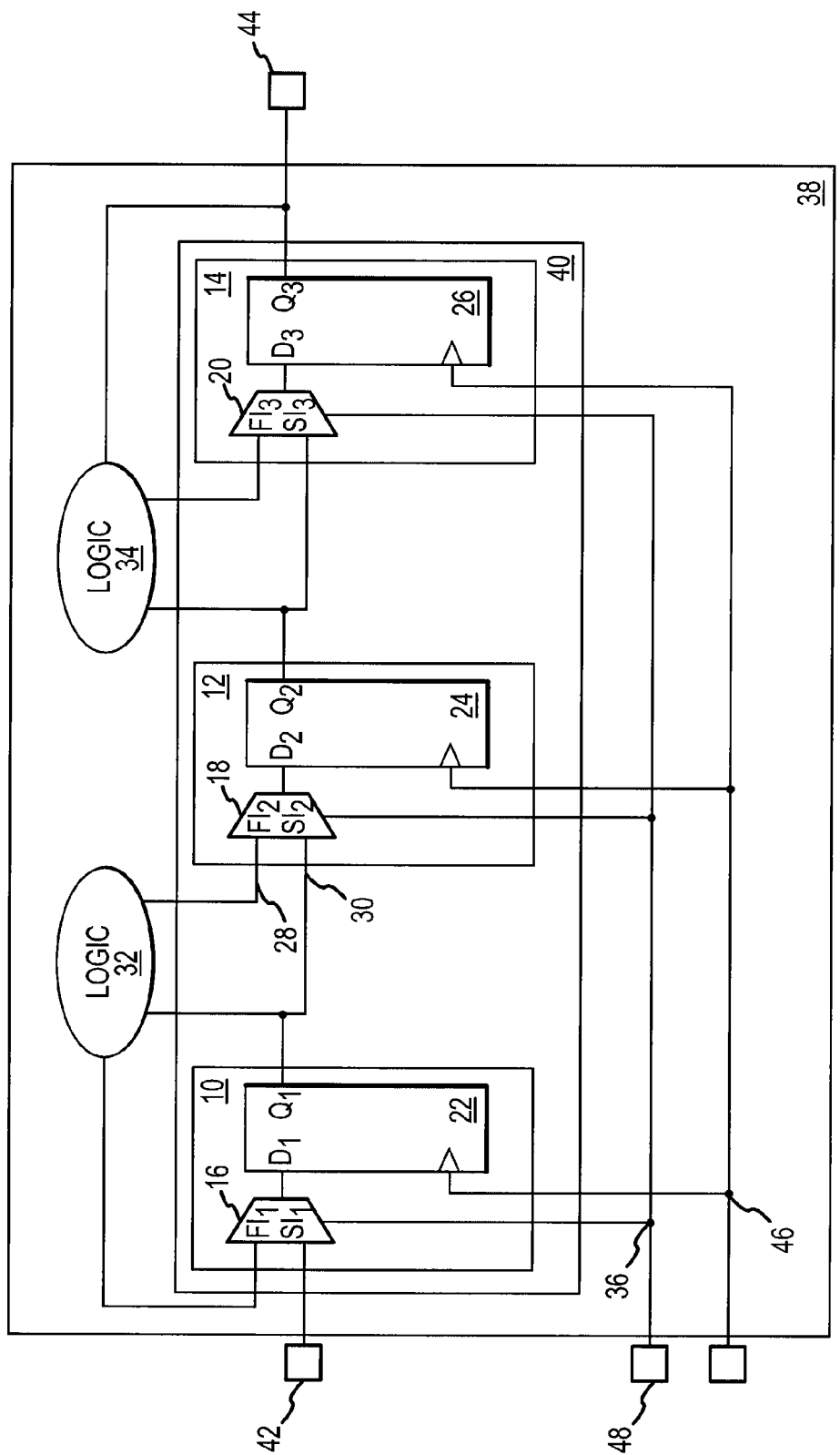
FIG. 1 depicts multiplexed flip-flops that may be configured as a scan chain during testing.
Figure 2:
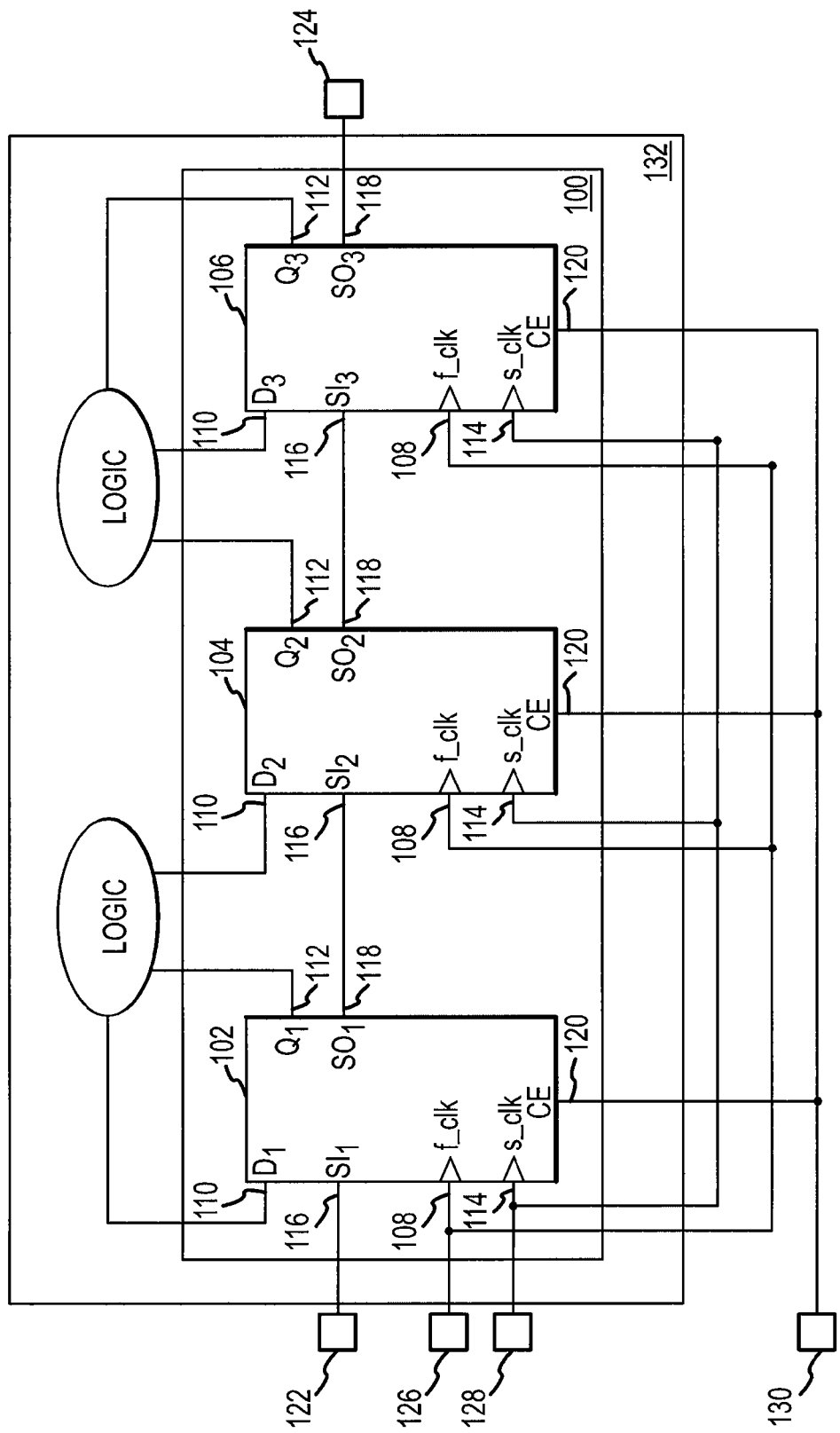
FIG. 2 depicts an integrated circuit with a scan chain employing storage elements with a separate scan function decoupled from the logic evaluation function that may be used during functional testing.

A first embodiment disclosed herein and conforming to aspects of the invention addresses the above issues of using a scan chain during functional testing by employing a scan chain implemented with storage elements each having a separate scan function that may operate independently of the logic evaluation function of each storage element. The independent operation of the two functions allows the functional test to run uninterrupted, while the logic state of the circuit may be captured and read out using the scan function whenever desired. FIG. 2 depicts a scan chain 100 employing scan storage elements 102, 104, 106 including two distinct modes of operation: a scan mode of operation; and a logic evaluation (functional) mode of operation. That is, each scan storage element 102, 104, 106 in the scan chain 100 may include a functional element and a scan element, each of which may maintain distinct states and may operate in parallel. The functional mode of operation for each storage element may include a functional clock input 108, a data input 110 and data output 112. The functional mode may be used during normal circuit operation. As a result, during functional testing, a microprocessor may execute functional code. In addition, logic evaluation may occur independently of scan chain operation.

The scan mode of each storage element 102, 104, 106 may employ a scan clock input 114, a scan input 116, a scan output 118 and a capture enable input 120. In one particular embodiment, the scan mode of the storage elements 102, 104, 106 may be connected together to form a shift register using the scan inputs and scan outputs. The scan input of the first storage element 102 in the chain may be connected to an input pin or pad 122 (scan input signal). The scan output of an intermediate (i.e., not the first nor the last storage element of the shift register) storage element may be connected to the scan input of the next storage element in the scan chain. The scan output of the last storage element in the chain may be connected to an output pin or pad 124 (scan output signal). Other embodiments may utilize multiple scan chains operating in parallel. This may be done, for example, to reduce the time necessary to shift out the scan capture results. Functional clock inputs 108 generally may be connected to an input pin 126 and scan clock inputs 114 generally may be connected to an input pin 128. The capture enable input 120 of each storage element also generally may be connected to an input pin 130.

The dual mode storage elements 102, 104, 106 may enable functional testing to operate concurrently with scan capture. The functional state of the circuit may be captured and stored in the scan mode portion of the storage elements, which may be flip-flops as shown. Capture of the functional state may be done at any time during functional testing to freeze the functional state of the circuit in the scan chain by asserting the capture enable input 120. Thus, functional testing may employ the functional mode of the storage elements 102, 104, 106. Additionally, functional state information generally may be captured in the scan chain 100, rather than capturing structural test results from scan patterns as is done during conventional scan testing.

The state of an integrated circuit 132 may be captured in the scan mode of the storage elements 102, 104, 106 by asserting the capture enable input 120 of each storage element. This causes the current functional state held in the functional mode of each storage element to be transferred to the scan mode of each storage element. This may be referred to as a snapshot. That is, the current functional state of the circuit may be captured and stored in the scan chain 100. The snapshot may be read out of the scan chain using the separate scan clock 114, for example, while functional testing continues to run using the functional mode of storage elements 102, 104, 106 and its own functional clock 108.

Figure 3:
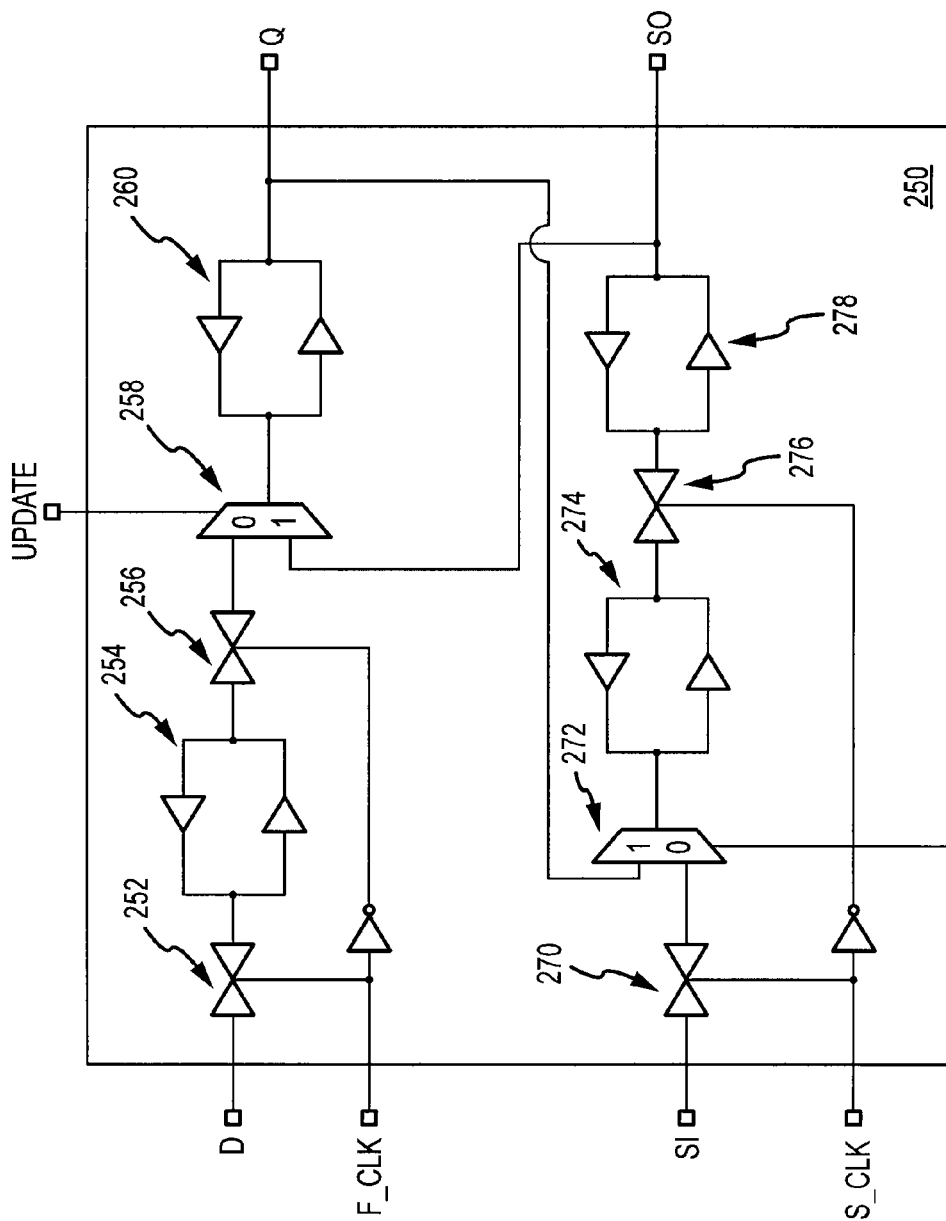
FIG. 3 depicts a logic diagram for an embodiment of a dual mode storage element.

FIG. 3 depicts a logic diagram for a dual mode storage element 250, such as elements 102, 104, and 106 of FIG. 2. The D (data in) input may be connected to the input of a transmission gate 252. The output of the transmission gate 252 may be connected to the input of a functional master latch 254. The output of the functional master latch 254 may be connected to one input of a two input mux 258 via a transmission gate 256. The other input of the mux 258 may be connected to the output of the scan slave latch 278. The output of the mux 258 may be connected to the input of the functional slave latch 260. The output of the functional slave latch may be connected to the Q (data out) output. An update signal Update, when asserted, allows the state of the scan slave latch 278 to be input to the functional slave latch 260. This feature may be used during structural testing. The scan input SI may be connected to a transmission gate 270. The output of the transmission gate 270 may be connected to one input of a two input mux 272. The other input of the mux 272 may be connected to the output of the functional slave latch 260. The capture enable signal CE selects which input of the mux 272 drives the input of the scan master latch 274. The output of the scan master latch 274 may be connected to a transmission gate 276. The output of the transmission gate 276 may be connected to the input of the scan slave latch 278. The output of the scan slave latch 278 may be connected to the scan output SO.

The dual mode storage element may operate as follows. When the functional clock signal F_CLK transitions to a logic zero, transmission gate 252 becomes transparent allowing the D input to be stored in the functional master latch 254.

When the functional clock F_CLK transitions to a logic one, transmission gate 252 becomes opaque. The functional master latch 254 holds the state of the D input. The transmission gate 256 becomes transparent allowing the mux 258 to transfer the state held in the functional master latch 254 to the functional slave latch 260 (during normal functional operation when Update is not asserted).

When capture enable CE is asserted, the Q output may be stored in the slave master latch 274. The captured functional state may be shifted out via SO by clocking the scan clock, S_CLK. When S_CLK transitions low, transmission gate 276 may become transparent allowing the state of the scan master latch 274 to be transferred to the scan slave latch 278.

An alternative embodiment may employ separate the scan-in and scan-out clocks to control the transmission gates 270 and 274. In this embodiment, transmission gate 270 may become transparent when the scan in clock transitions to a logic one. The transmission gate 276 may become transparent when the scan out clock signal transitions to a logic one.

Figure 4:
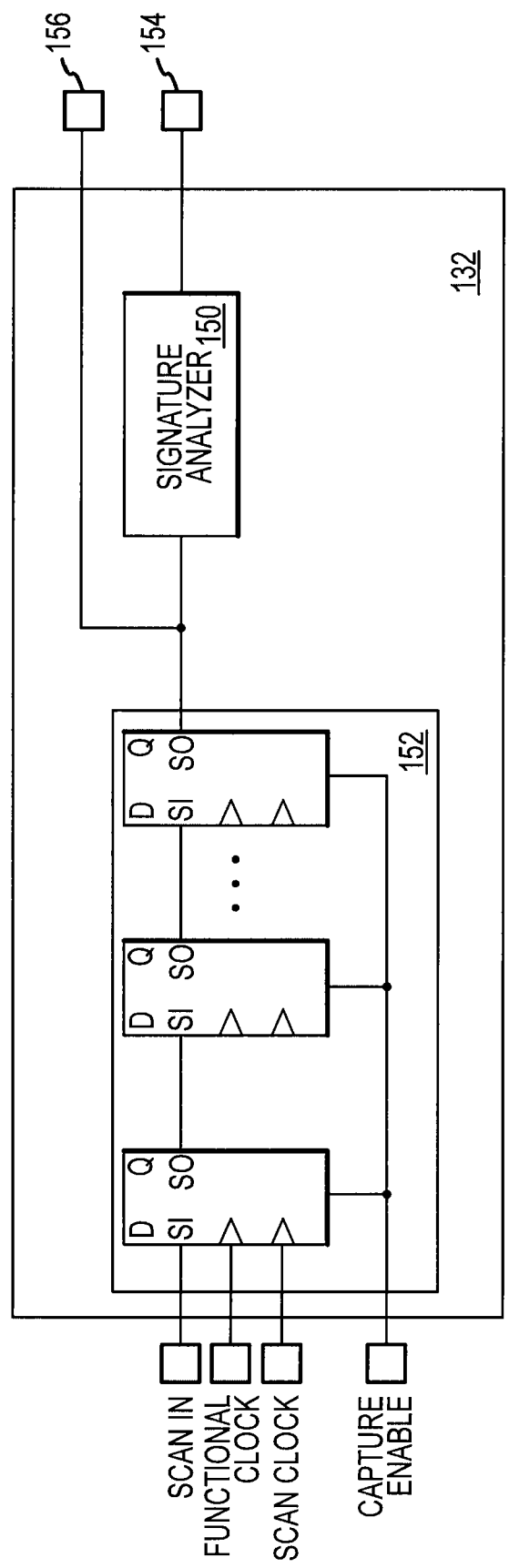
FIG. 4 depicts an integrated circuit with the scan chain of FIG. 2 and a signature analyzer for compressing the contents of the scan chain.

A very long scan chain may take more time to read out than is available between snapshots. An exemplary embodiment may employ a signature analyzer 150, including, but not limited to, a linear feedback shift register (LFSR) to calculate a signature of a output sequence of a scan chain 152, as depicted in FIG. 4. The output of the last flip-flop in the scan chain 152 may be fed into the input of the signature analyzer 150. The signature computed by the signature analyzer 150 generally depends on the initial state (after a reset) of the signature analyzer 150 and all data input values clocked into the signature analyzer 150 since initialization.

The signature analyzer 150 may comprise an LFSR including a length of 64 bits, 128 bits or some other length. The length of the LFSR may be chosen to provide an acceptable aliasing error. A longer length LFSR may reduce the chance of an aliasing error. An aliasing error may occur when the signature of a faulty circuit matches the signature of a fault-free circuit.

After several cycles of shifting data serially into the signature analyzer 150, the signature analyzer 150 may hold a signature of the data. The output of the signature analyzer 150 may be made available on an output pin 154 so that the signature may be read by shifting it out using a scan clock 156. Other embodiments may employ multiple scan chains, each scan chain including its own signature analyzer. This may be desirable, for example, when the internal clock rate is substantially faster than the I/O clock rate as described below.

Some embodiments may make the input to the signature analyzer 150 (the scan output of the last flip-flop of the chain) available on an output pin 156 so that the output data sequence of the scan chain may be read out to provide more detailed information, for example, during circuit debug.

Figure 5A:
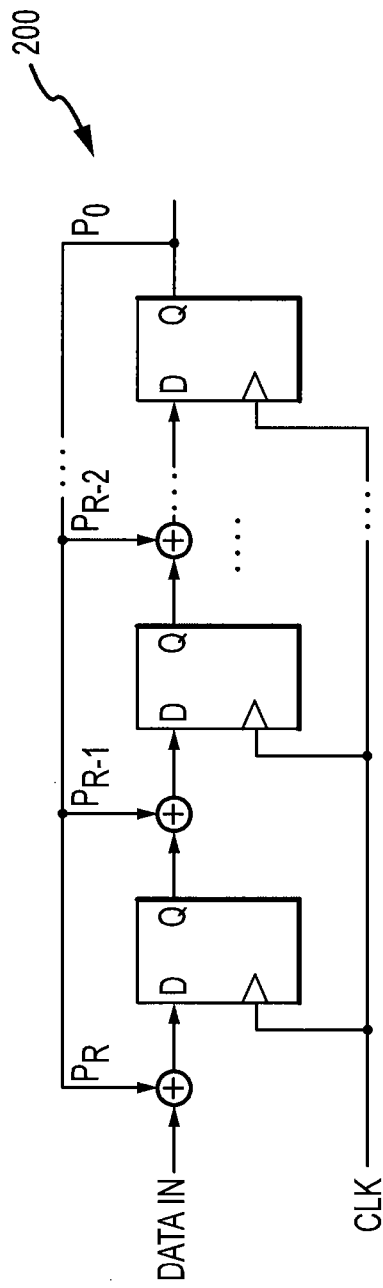
FIG. 5A depicts a serial signature analyzer implemented as a linear feedback shift register with flip-flops and feedback exclusive OR gates between the flip-flops.
Figure 5B:
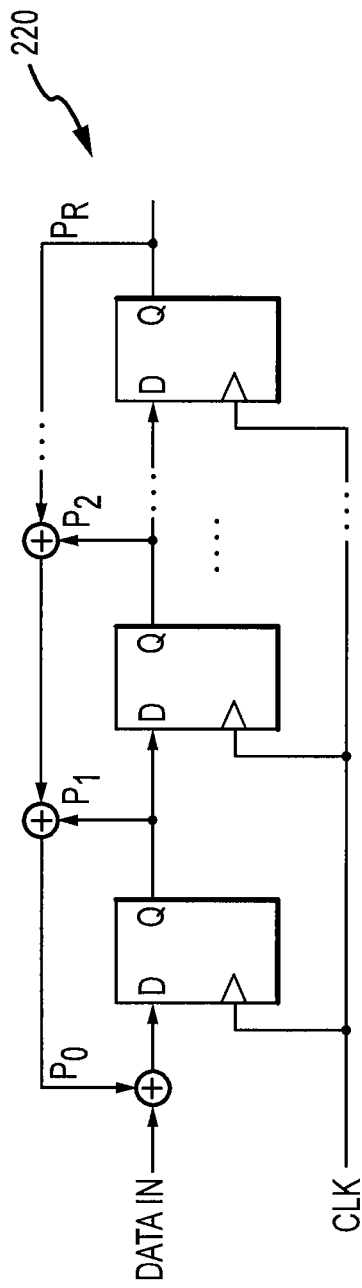
FIG. 5B depicts a serial signature analyzer implemented as a linear feedback shift register with flip-flops and feedback exclusive OR gates in the feedback path.

FIGS. 5A and 5B depict two types of LFSRs that may be employed as a serial signature analyzer (SSA) in some embodiments. FIG. 5A depicts an SSA 200 with feedback exclusive OR (XOR) gates between the flip-flops. FIG. 5B depicts an SSA 220 with feedback XOR gates in the feedback path.

Figure 6:
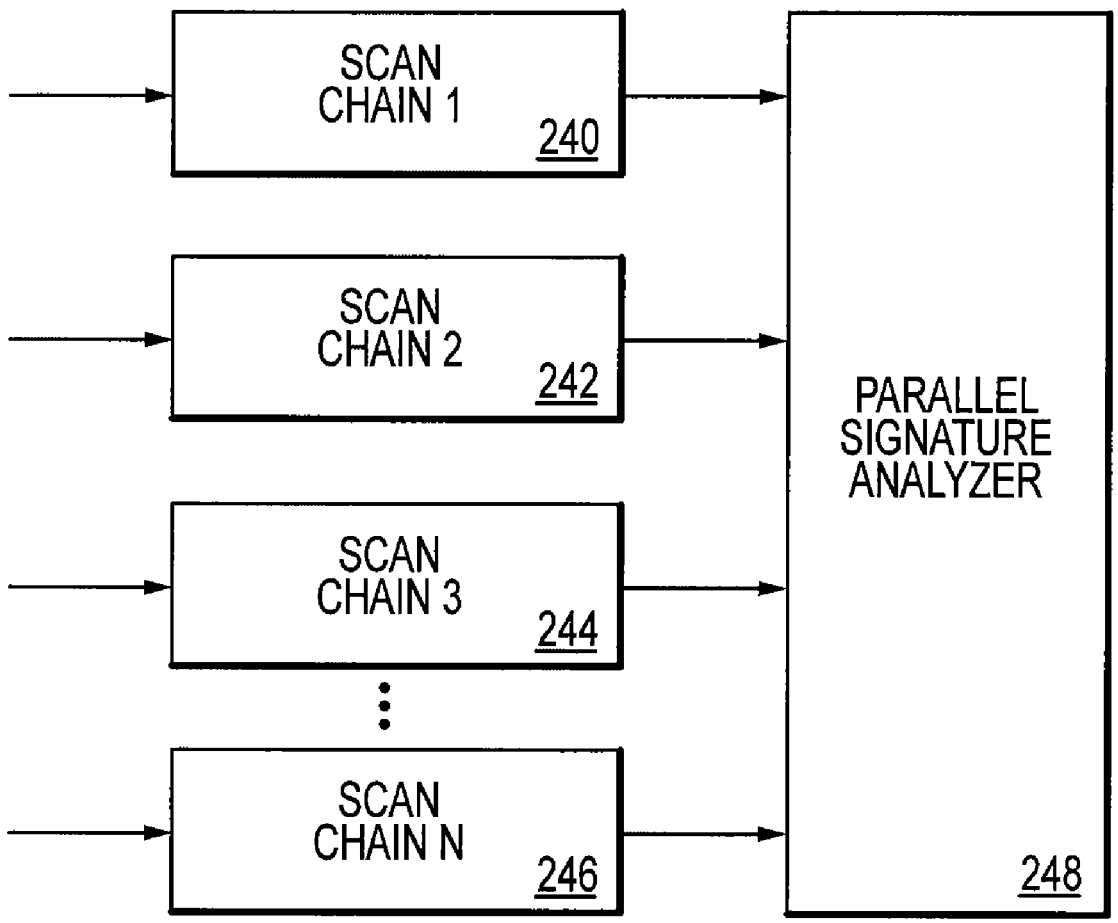
FIG. 6 depicts an embodiment employing multiple scan chains connected to a parallel signature analyzer.

Other embodiments may employ multiple scan chains connected to a parallel signature analyzer, rather than employing scan chains with separate serial signature analyzers. FIG. 6 depicts one embodiment that may employ multiple scan chains 240, 242, 244, 246. Each scan chain output may be connected to an input of a parallel signature analyzer 248.

One embodiment may, during functional and/or diagnostic testing, combine multiple snapshots into a final signature. First, functional or diagnostic testing may be started. As functional or diagnostic testing runs, a capture operation is performed every n cycles by asserting the capture enable signal to latch the functional state of the chip into the scan portion of the flip-flops (a snapshot). As functional testing continues, the data captured in the scan chain may be shifted into a signature analyzer using the scan clock. As the data is shifted in, the signature analyzer may compute a signature of the snapshot. At the conclusion of functional testing, the signature analyzer may contain a final signature of all the individual snapshots taken during the functional testing (by not resetting the signature analyzer between snapshots). This final signature may be shifted out using the scan clock and may be compared with an expected signature to provide a pass/fail test.

It should be understood that computing a signature of the data inside the chip and executing functional code may reduce functional tester memory requirements. Rather than the ATE storing one bit per pin per test cycle, the ATE may only store the signature, typically on the order of one hundred bits.

The time taken to shift all the data in the scan chain into the signature analyzer 150 generally should be less that the time taken to perform n cycles of functional test execution. In certain situations, this constraint may be satisfied by partitioning the scan chain into multiple smaller scan chains operating in parallel, each with its own signature analyzer. Alternatively, one parallel signature analyzer may be used in place of the individual signature analyzers to compress the data streams from the multiple scan chains into a signature.

An exemplary embodiment may take multiple snapshots of the functional state of the integrated circuit during functional testing. A snapshot generally occurs over multiple clock cycles. A signature of each snapshot may be determined by serially shifting the contents of the flip-flops of the scan chain through the signature analyzer 150. That is, each snapshot state may be serially shifted into the signature analyzer 150, without the signature analyzer 150 being reset during functional testing. This results in a final signature that may be used as a pass/fail test during manufacturing test. For example, each individual integrated circuit may be run at various clock speeds and the final signature used to determine the maximum speed the circuit operates at so that it can be sorted based on speed (speed binning).

Figure 7:
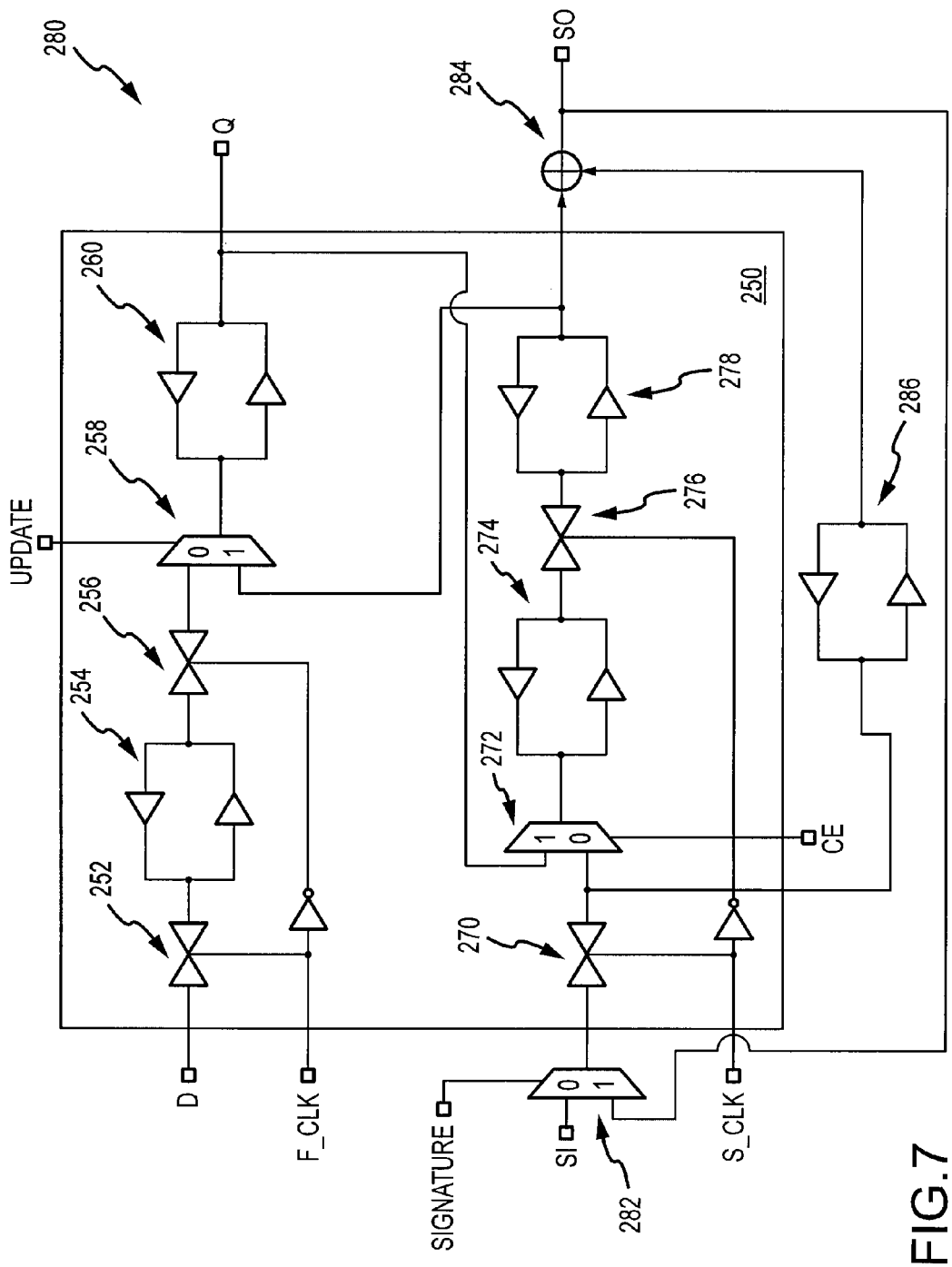
FIG. 7 depicts a logic diagram of one embodiment of a dual mode storage element with built-in signature compression.

Another embodiment of the present invention may construct a signature analyzer using the scan chain itself. This may be done by adding feedback paths in the scan chain to form a signature analyzer, for example, a LFSR. This may allow computation of the signature with one additional clock cycle. FIG. 7 depicts one embodiment of a storage element 280 with built-in signature computation. The storage element 280 may be implemented by modifying the dual mode storage element 250 of FIG. 3. The scan input SI may be connected to one input of a two input mux 282. The other input of the mux 282 may be connected to the scan output SO. A signature signal Signature, when asserted, may connect the scan output SO to the transmission gate 270. The output of the scan slave latch 278 may be connected to one input of a two input XOR gate 284. The other input of the XOR gate 284 may be connected to output of a latch 286. The input of the latch 286 may be connected to the output of transmission gate 270.

When the Signature signal is asserted, the output of the XOR gate may be transferred to the latch 286 by clocking S_CLK which causes the transmission gate 270 to become transparent. Then, when the signal CE is asserted, the scan master latch captures the current functional state Q. When the scan clock S_CLK goes low, the scan master latch state (current functional state) is transferred to the scan slave latch 278. The XOR gate 284 combines the current functional state held by the scan slave latch 278 with the previous cycle information held by latch 286. Various embodiments may selectively enable the exclusive OR gates to compute a signature on each capture cycle.

An alternative embodiment may use scan chain storage elements with a third state to store the compressed signature, for example, to avoid overwriting the current signature when the next capture is performed.

Various embodiments present advantages over current testing techniques, including the ability to do at speed functional testing. This may allow speed binning of complex circuits, such as microprocessors, to be performed. Various embodiments may not require modification of the functional testing. Functional testing may operate as usual. The use of a scan chain including storage elements that may operate in a functional mode and in a scan mode, may provide better observability of faults during functional testing. A fault may only be propagated to a flip-flop of the scan chain, rather than being propagated all the way to an output pin. Various embodiments may not require the use of plesiochronous I/O pins for improved test times because functional testing may run uninterrupted while functional state information may be captured often enough to observe faults. Compression of functional state information into a signature may further reduce a need for high speed I/O pins when shifting out the results. Further, various embodiments may reduce an amount of tester memory required for functional testing. By compressing the snapshots of functional states captured by the scan chain, approximately one to two hundred bits of memory may be used to store the final test result.

What is claimed is:

1. A circuit for capturing an internal state of an integrated circuit during functional testing, the circuit comprising:
   a first plurality of storage elements configured as a first scan chain with a first scan chain output, each storage element associated with an input logic node and an output logic node; and
   wherein the storage elements are configured to capture a logic state of the corresponding output logic node when a capture enable is asserted and further configured to serially shift out the captured logic state when a scan clock is pulsed, the serial shifting occurring concurrently with functional operation of the integrated circuit.

2. The circuit of claim 1, wherein each storage element comprises:
   a data input, a data output, a scan input, a scan output, a functional clock input, a scan clock input, and a capture enable operably configured to transfer a data value from the data output to the scan input when asserted; and
   wherein the scan output of a preceding storage element in the first scan chain is operably coupled to the scan input of the next storage element in the first scan chain, the functional clock input is connected to a functional clock signal, the scan clock input is connected to a scan clock signal, the capture enable is operably coupled a capture enable signal, the data input is operably coupled to a corresponding input logic node, and the data output is operably coupled to a corresponding output logic node of the integrated circuit.

3. The circuit of claim 1 further comprising:
   a signature analyzer operably coupled to the first scan chain output and the scan clock.

4. The circuit of claim 3 wherein the signature analyzer comprises a linear feedback shift register.

5. The circuit of claim 1 wherein each storage element comprises:
   a functional master latch;
   a functional slave latch operably coupled to the functional master latch;
   a scan master latch;
   a scan slave latch operably coupled to the scan master latch;
   wherein the scan master latch transfers a data value to the scan slave latch when the scan clock is asserted; and
   wherein when the capture enable is asserted, a data value from the functional slave latch is transferred to the scan master latch.

6. The circuit of claim 5 wherein each storage element further comprises:
   a mux having a first mux input operably coupled to a scan input of the storage element, a second mux input operably coupled to a scan output of the storage element, and a mux output operably coupled to an input of the functional master latch;
   an exclusive or gate having a first input operably coupled to the scan slave latch output and an output operably coupled to the scan output;
   a latch having a latch output operably coupled to a second input of the exclusive or gate and a latch input operably coupled to the mux output; and
   wherein assertion of a signature signal operates to select the second mux input.

7. The circuit of claim 1, further comprising:
   a second plurality of storage elements configured as a second scan chain with a second scan chain output, each storage element associated with an input logic node and an output logic node; and
   wherein the second plurality of storage elements is configured to capture a logic state of the corresponding output logic node when the capture enable is asserted and further configured to serially shift out the captured logic state when the scan clock is pulsed, the serial shifting occurring concurrently with functional operation of the integrated circuit.

8. The circuit of claim 7, further comprising a parallel signature analyzer operably coupled to the first scan chain output, the second scan chain output and the scan clock.

* * * * *